(12) United States Patent
Engl et al.

(10) Patent No.: US 8,928,052 B2
(45) Date of Patent: Jan. 6, 2015

(54) OPTOELECTRONIC SEMICONDUCTOR CHIP AND METHOD FOR PRODUCING SAME

(75) Inventors: Karl Engl, Niedergebraching (DE); Lutz Hoeppel, Alteglofsheim (DE); Patrick Rode, Regensburg (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1134 days.

(21) Appl. No.: 12/921,379

(22) PCT Filed: Mar. 13, 2009

(86) PCT No.: PCT/DE2009/000354
§ 371 (c)(1),
(2), (4) Date: Nov. 12, 2010

(87) PCT Pub. No.: WO2009/121319
PCT Pub. Date: Oct. 8, 2009

(65) Prior Publication Data
US 2011/0049555 A1 Mar. 3, 2011

(30) Foreign Application Priority Data

Mar. 31, 2008 (DE) .......... 10 2008 016 524
Jul. 9, 2008 (DE) .......... 10 2008 032 318

(51) Int. Cl.
*H01L 31/062* (2012.01)
(Continued)

(52) U.S. Cl.
CPC .............. *H01L 33/382* (2013.01); *H01L 33/40* (2013.01); *H01L 33/46* (2013.01);
(Continued)

(58) Field of Classification Search
USPC .............. 257/292, 288, 88, 98, 103, 79, 104, 257/199, 200, 201, 248, 396, E21.006, 257/E21.042, E21.053, E21.056, E21.267, 257/E21.347, E21.352, E21.077, E21.085, 257/E21.126, E21.127, E21.17
See application file for complete search history.

(56) References Cited

U.S. PATENT DOCUMENTS 5,684,309 A 11/1997 McIntosh et al.
5,831,277 A 11/1998 Razeghi
(Continued)

FOREIGN PATENT DOCUMENTS

DE 101 47 886 A1 4/2003
DE 10 2004 012 219 A1 6/2005
(Continued)

OTHER PUBLICATIONS

Schnitzer, I., et al., "30% External Quantum Efficency from Surface Textured, Thin-Film Light-Emitting Diodes," Applied Physics Letter, 1993, 3 pages, vol. 63, No. 16.
(Continued)

*Primary Examiner* — David Nhu
(74) *Attorney, Agent, or Firm* — Slater & Matsil, L.L.P.

(57) ABSTRACT

An optoelectronic semiconductor chip has a semiconductor layer sequence having an active layer that generates radiation between a layer of a first conductivity type and a layer of a second conductivity type. The layer of the first conductivity type is adjacent to a front side of the semiconductor layer sequence. The semiconductor layer sequence contains at least one cutout extending from a rear side, lying opposite the front side, of the semiconductor layer sequence through the active layer to the layer of the first conductivity type. The layer of the first conductivity type is electrically connected through the cutout by means of a first electrical connection layer which covers the rear side of the semiconductor layer sequence at least in places.

16 Claims, 3 Drawing Sheets

(51) Int. Cl.
*H01L 31/113* (2006.01)
*H01L 33/38* (2010.01)
*H01L 33/40* (2010.01)
*H01L 33/46* (2010.01)
*H01L 33/62* (2010.01)

(52) U.S. Cl.
CPC ........ *H01L 33/62* (2013.01); *H01L 2924/0002* (2013.01)
USPC .... 257/292; 257/200; 257/288; 257/E21.006; 257/E21.042; 257/E21.053; 257/E21.056; 257/E21.267; 257/E21.347; 257/E21.352

(56) References Cited

U.S. PATENT DOCUMENTS

| | | | |
|---|---|---|---|
| 5,945,689 A * | 8/1999 | Koike et al. | 257/88 |
| 6,111,272 A | 8/2000 | Heinen | |
| 6,172,382 B1 | 1/2001 | Nagahama et al. | |
| 6,291,840 B1 | 9/2001 | Uemura et al. | |
| 6,849,881 B1 | 2/2005 | Harle et al. | |
| 6,998,642 B2 * | 2/2006 | Lin et al. | 257/79 |
| 8,158,995 B2 * | 4/2012 | Ploessl et al. | 257/98 |
| 8,598,705 B2 * | 12/2013 | Moosburger et al. | 257/750 |
| 2002/0017652 A1 | 2/2002 | Illek et al. | |
| 2005/0056855 A1 | 3/2005 | Lin et al. | |
| 2005/0062049 A1 | 3/2005 | Lin et al. | |
| 2006/0033113 A1 | 2/2006 | Lee et al. | |
| 2006/0289886 A1 | 12/2006 | Sakai | |
| 2007/0096130 A1 | 5/2007 | Schiaffino et al. | |
| 2007/0246716 A1 | 10/2007 | Bhat et al. | |
| 2009/0090900 A1 | 4/2009 | Avramescu et al. | |
| 2010/0117111 A1 | 5/2010 | Illek et al. | |
| 2010/0171135 A1 | 7/2010 | Engl et al. | |
| 2010/0230698 A1 | 9/2010 | Rode et al. | |

FOREIGN PATENT DOCUMENTS

| | | |
|---|---|---|
| DE | 10 2007 003 282 A1 | 7/2008 |
| DE | 10 2007 019 775 A1 | 10/2008 |
| DE | 10 2007 019 776 A1 | 10/2008 |
| DE | 10 2007 022 947 A1 | 10/2008 |
| DE | 10 2008 021 403 A1 | 4/2009 |
| DE | 10 2008 005 332 A1 | 6/2009 |
| EP | 0845 818 A2 | 6/1998 |
| EP | 0 905 797 A2 | 3/1999 |
| JP | 59-124126 A | 7/1984 |
| JP | 08-191055 A | 7/1996 |
| JP | 10-135515 A | 5/1998 |
| JP | 2004-047988 A | 2/2004 |
| JP | 2006-054420 A | 2/2006 |
| JP | 2006-344971 A | 12/2006 |
| JP | 2007-005591 A | 1/2007 |
| JP | 2007-059508 A | 3/2007 |
| JP | 2007-518260 A | 7/2007 |
| JP | 2007-529879 A | 10/2007 |
| TW | I223460 B | 11/2004 |
| WO | WO 01/39282 A2 | 5/2001 |
| WO | WO 02/13281 A1 | 2/2002 |
| WO | WO 2007/007634 A1 | 1/2007 |
| WO | WO 2007/012327 A1 | 2/2007 |

OTHER PUBLICATIONS

Smith, L. L., et al., "Microstructure, Electrical Properties, and Thermal Stability Al Ohmic Contacts to N—GaN," XP-002990891, Materials Research Society, Sep. 1996, pp. 2257-2262, vol. 11, No. 9.
Jang, J.-S., et al., "Metallization Scheme for Highly Low-Resistance, Transparent, and Thermally Stable Ohmic Contacts to p-GaN," Applied Physics Letters, May 15, 2000, pp. 2898-2900, vol. 76, No. 20.
Reddy, N. R., et al., "Microstructural Properties of Thermally Stable Ti/W/Au Ohmic Contacts on n-Type GaN," Microelectronic Engineering, 2006, pp. 1981-1985, Elsevier.

\* cited by examiner

OPTOELECTRONIC SEMICONDUCTOR CHIP AND METHOD FOR PRODUCING SAME

This patent application is a national phase filing under section 371 of PCT/DE2009/000354, filed Mar. 13, 2009, which claims the priority of German patent application 10 2008 016 524.7, filed Mar. 31, 2008, and German patent application 10 2008 032 318.7, filed Jul. 9, 2008, each of which is incorporated herein by reference in its entirety.

TECHNICAL FIELD

The present application relates to an optoelectronic semiconductor chip and to a method for producing an optoelectronic semiconductor chip.

BACKGROUND

In one aspect, the present application specifies an optoelectronic semiconductor chip having an improved overall electro-optical efficiency.

An optoelectronic semiconductor chip is specified comprising a semiconductor layer sequence having an active layer provided for generating radiation between a layer of a first conductivity type and a layer of a second conductivity type.

By way of example, the layer of the first conductivity type is an n-conducting layer. The layer of the second conductivity type is then a p-conducting layer. As an alternative, the layer of the first conductivity type can also be a p-conducting layer and the layer of the second conductivity type can also be an n-conducting layer.

The active layer preferably contains a pn junction, a double heterostructure, a single quantum well (SQW) or a multi quantum well structure (MQW), for generating radiation. In this case, the designation quantum well structure does not exhibit any significance with regard to the dimensionality of the quantization. It therefore encompasses, inter alia, quantum wells, quantum wires and quantum dots and any combination of these structures. Examples of MQW structures are described in the documents WO 01/39282, U.S. Pat. No. 5,831,277, U.S. Pat. No. 6,172,382 B1 and U.S. Pat. No. 5,684,309, the disclosure content of which in this respect is hereby incorporated by reference.

The layer of the first conductivity type is adjacent to a front side of the semiconductor layer sequence. The layer of the second conductivity type is adjacent, in particular, to a rear side of the semiconductor layer sequence. The rear side of the semiconductor layer sequence is arranged in a manner lying opposite the front side. The semiconductor chip is provided, in particular, for the emission of an electromagnetic radiation generated by the active layer from its front side.

In accordance with at least one embodiment, the semiconductor layer sequence contains at least one cutout extending from the rear side of the semiconductor layer sequence through the active layer to the layer of the first conductivity type.

The cutout therefore constitutes a depression extending into the semiconductor layer sequence from the rear side in the direction of the front side. In one configuration, the depression has the form of a blind hole. The cutout has, for example, a central axis running perpendicularly or obliquely with respect to a main extension plane of the semiconductor layer sequence. The cutout expediently runs through the layer of the second conductivity type and the active layer. The cutout extends, in particular, from the rear side into the layer of the first conductivity type and preferably ends in a central region of the layer of the first conductivity type.

In this embodiment, the layer of the first conductivity type is electrically connected through the cutout by means of a first electrical connection layer, which covers the rear side of the semiconductor layer sequence at least in places. Expediently, in the cutout, the first electrical connection layer is electrically insulated from the active layer and the layer of the second conductivity type by means of an electrical isolation layer.

The fact that the first electrical connection layer covers the rear side of the semiconductor layer sequence at least in places means in the present case that at least one part of the first electrical connection layer succeeds the semiconductor layer sequence in a direction from the front side toward the rear side. However, it is not necessary for the entire first electrical connection layer to be arranged at the rear side. Rather, a partial region of the first electrical connection layer extends from the rear side into the cutout as far as the layer of the first conductivity type. In particular, the first electrical connection layer adjoins the semiconductor layer sequence in the region of the cutout. The first electrical connection layer is a metallic layer, for example, that is to say that it comprises a metal or a plurality of metals or consists thereof. It is provided for feeding an electric operating current to the semiconductor layer sequence.

If the layer of the first conductivity type has a central region, the latter constitutes a current distribution layer, for example. For this purpose, it can have an increased dopant concentration, for example. By way of example, the concentration of a dopant of the first conductivity type in the central layer is five times, in particular, 10 times, as high as in a partial region of the layer of the first conductivity type which adjoins the central region in the direction of the front side and/or in the direction of the rear side. As an alternative or in addition, the central region can have a superlattice of alternating layers. In the case of such a superlattice, the layers, for example, alternating GaN and AlGaN layers, have in one configuration a layer thickness of less than or equal to 10 nm, preferably of less than or equal to 5 nm, and in particular of less than or equal to 2 nm. It may be provided that in each case one of the alternating layers is doped with a dopant of the first conductivity type and the other layer is nominally undoped.

In this embodiment, the semiconductor chip contains, in the region of the cutout, a junction layer having a material composition composed of material of the layer of the first conductivity type and composed of material of the first electrical connection layer. In particular, the cutout and the junction layer overlap laterally.

The fact that the junction layer has a material composition composed of material of the layer of the first conductivity type and composed of material of the first electrical connection layer is understood to mean in the present context, in particular, that the material of the layer of the first conductivity type and the material of the first electrical connection layer are mixed with one another. Preferably, the junction layer has a uniform material composition, for example, in the manner of an alloy, between the material of the layer of the first conductivity type and the material of the first electrical connection layer. In this case, it is possible for the proportion of the material of the first electrical connection layer to decrease continuously or in steps over the layer thickness of the junction layer in the course from the rear side to the front side. By way of example, the material of the first electrical connection layer is indiffused into the material of the layer of the first conductivity type.

A particularly low electrical contact resistance between the first electrical connection layer and the layer of the first conductivity type is advantageously obtained by means of the junction layer. Preferably, the contact resistance is less than or equal to $2 \times 10^{-5}$ ohms/cm$^2$, for example, approximately $2 \times 10^{-6}$ ohms/cm$^2$. A low contact resistance is advantageous particularly during operation of the semiconductor chip with a high operating current, for instance of 1 A or more, for example, of 1.4 A or more. At high operating currents, the contact resistance can dominate the characteristic curve of the semiconductor chip.

In one configuration of this embodiment, a maximum lateral extent of the cutout is greater than or equal to 10 µm. In another configuration, the maximum lateral extent of the cutout is less than or equal to 30 µm.

In a further configuration, the semiconductor chip has a plurality of cutouts having a lateral distance from one another of greater than or equal to 75 µm. In a further configuration, the lateral distance is less than or equal to 125 µm. It preferably has a value of between 75 µm and 125 µm, inclusive of the limits. In this case, the lateral distance of the cutouts from one another is the distance between respectively two laterally successive cutouts.

In one configuration, a total area of the cutouts in a plan view of the rear side is less than or equal to 5 percent, in particular, less than or equal to 2 percent of the rear-side main area of the semiconductor layer sequence. The rear-side main area is that part of the surface of the semiconductor layer sequence which faces the rear side.

Therefore, such a small total area of the cutouts is advantageous for the optical efficiency of the semiconductor chip. Conventional semiconductor chips often have an electrical connection area which covers ten percent or more of a main area of the semiconductor layer sequence. In the present case, the area of the electrical connections of the layer of the first conductivity type is predefined by the area of the cutouts. The loss of active area due to the electrical connections of the layer of the first conductivity type is particularly small in this way. Despite such a small electrical connection area, a comparatively low electrical contact resistance between the semiconductor layer sequence and the first electrical connection layer can nevertheless be obtained by means of the junction layer.

In another embodiment, the optoelectronic semiconductor chip has, as an alternative or in addition to a first electrical connection layer, by means of which the layer of the first conductivity type is connected through a cutout, a second electrical connection layer, which covers the rear side of the semiconductor layer sequence at least in places. The layer of the second conductivity type is electrically connected by means of the second electrical connection layer.

The first electrical connection layer and the second electrical connection layer are electrically insulated from one another, in particular, by means of an electrical isolation layer. In one preferred configuration, the first electrical connection layer, the second electrical connection layer and the electrical isolation layer overlap laterally at the rear side of the semiconductor chip.

In such a configuration, by way of example, the light-emitting front side of the semiconductor chip is free of electrical contact locations such as bonding pads. The risk of shading and/or absorption of part of the electromagnetic radiation emitted by the active layer during operation by the electrical contact locations can be reduced in this way.

In one development of this embodiment, the semiconductor chip has an electrically insulating mirror layer at the rear side of the semiconductor layer sequence. The electrically insulating mirror layer has a plurality of openings through which the layer of the second conductivity type is electrically connected by means of the second electrical connection layer. In particular, therefore, the electrically insulating mirror layer is arranged at least in places between the semiconductor layer sequence and the first and/or second electrical connection layer. Instead of an electrically insulating mirror layer, a semiconducting mirror layer can also be provided.

A refractive index of the mirror layer deviates, for example, by 1 or more from the refractive index of a layer of the semiconductor layer sequence which succeeds the mirror layer in the direction of the front side and, in particular, adjoins the latter. In one configuration, the mirror layer contains a dielectric such as SiO$_2$ or silicon nitride (SiN$_x$). In one development, the electrically insulating mirror layer contains a distributed Bragg reflector (DBR) containing at least one pair of layers having alternately high and low refractive indices. The layers of the Bragg reflector contain, for example, silicon dioxide, tantalum dioxide and/or titanium dioxide.

The electrically insulating mirror layer has, for example, on account of the change in the refractive index, a particularly high reflection coefficient, such that it reflects electromagnetic radiation emitted by the active layer in the direction of the rear side back in the direction of the front side particularly efficiently.

In one configuration, the electrically insulating mirror layer contains at least one low refractive index material. In the present case, a low refractive index material is understood to mean a material having a refractive index of less than or equal to 1.38, preferably of less than or equal to 1.25.

Such a low refractive index material comprises, for example, a matrix material containing pores. The matrix material can be silicon dioxide, for example. The pores are filled, in particular, with a gas, for instance air. The matrix material has, for example, a refractive index that is greater than the refractive index of the gas. By virtue of the pores, the effective refractive index of the low refractive index material is lowered below the refractive index of the matrix material. The pores have, in particular, extents in the nanometers range, for example, of less than or equal to 8 nm, preferably of less than or equal to 3 nm.

A particularly high critical angle of total reflection is advantageously obtained with the low refractive index material. Even light beams which impinge comparatively steeply on the electrically insulating mirror layer are thus totally reflected by means of the low refractive index material.

In one development, the low refractive index material additionally has a dielectric constant of less than or equal to 3.9, preferably of less than or equal to 2.7. By way of example, a low refractive index material having a dielectric constant of less than or equal to 3.9, and in particular, of less than or equal to 2.7, absorbs only comparatively little electromagnetic radiation in the case of a layer thickness in the range of up to a few 100 nanometers. Preferably, the absorption coefficient of the electrically insulating mirror layer is less than or equal to $10^{-3}$.

Instead of pores or in addition to the pores, the low refractive index material can also contain one or more additives. By way of example, fluorine, chlorine or C-H are suitable additives for silicon dioxide. In particular, these substances occupy binding sites at the silicon and thus prevent the formation of a fully crystalline network composed of silicon dioxide.

A low refractive index material having pores can be produced, for example, by such additives being driven out again from the matrix material by means of a suitable process, for example, by heating. In the case of silicon dioxide, by way of example, a low refractive index material having a refractive index of approximately 1.14 can be obtained in this way.

In one configuration, the electrically insulating mirror layer covers at least 50 percent of the rear-side main area of the semiconductor layer sequence. It preferably reflects at least 96 percent of the light impinging on it back in the direction of the front side.

The electrically insulating mirror layer can also have a refractive index of less than 1 or, for a predefined frequency range, even a refractive index of less than 0. A mirror layer of this type can be realized by means of a photonic crystal, for example. By means of a three-dimensional photonic crystal, for example, a total reflection of the electromagnetic radiation emitted by the active layer can be obtained independently of the angle of incidence on the electrically insulating mirror layer. For this purpose, the periods of the three-dimensional photonic crystal are, for example, at a quarter of the wavelength of an emission maximum of the active layer.

In one advantageous configuration, the electrically insulating mirror layer has, in the direction from the front side to the rear side, firstly a layer comprising a low refractive index material and then a Bragg reflector. By means of the layer comprising the low refractive index material, electromagnetic radiation which is emitted by the active layer and which impinges on the mirror layer at a comparatively shallow angle is reflected back by total reflection to the front side. Electromagnetic radiation which is emitted by the active layer and which impinges on the mirror layer at a steep angle, for example, perpendicularly, is transmitted by the layer comprising the low refractive index material and is reflected back to the front side by the Bragg reflector, which has a high reflection coefficient, in particular, for steeply impinging electromagnetic radiation.

In a further advantageous configuration, the optoelectronic semiconductor chip contains a further junction layer between the second electrical connection layer and the layer of the second conductivity type, the further junction layer having a material composition composed of material of the layer of the second conductivity type and material of the second electrical connection layer.

In one variant of the semiconductor chip, the layer of the second conductivity type is electrically connected indirectly by means of the second electrical connection layer. In particular, the layer of the second conductivity type, if appropriate the further junction layer and the second electrical connection layer do not succeed one another directly in the case of this variant. In one development of this variant, the semiconductor layer sequence contains a tunnel junction and a further layer of the first conductivity type, which succeed the layer of the second conductivity type in this order toward the rear side. Examples of such a semiconductor layer sequence, for instance an npn-semiconductor layer sequence are described in the document WO 2007/012327 A1, the disclosure content of which in this respect is hereby incorporated by reference. In the case of a semiconductor chip in accordance with this development which has a further junction layer, the further junction layer contains material of the further layer of the first conductivity type instead of material of the layer of the second conductivity type.

In another configuration of the semiconductor chip, the openings of the electrically insulating mirror layer have a maximum lateral extent, that is to say, by way of example, a diameter in the case of circular holes or a diagonal in the case of rectangular holes, of less than or equal to 1 μm. Laterally successive openings have a lateral distance of less than or equal to 5 μm.

In particular in the case of a further junction layer between the second electrical connection layer and a layer of the second conductivity type which is a p-conducting layer, the operating current can be impressed into the p-conducting layer particularly homogeneously in this way. It is particularly advantageous if a ratio between a distance between two adjacent openings and a maximum lateral extent of the openings or of at least one of the openings is less than or equal to 10.

In one configuration, the junction layer and/or the further junction layer have/has a layer thickness, that is in the present case, in particular, the extent thereof in the direction from the rear side to the front side, of greater than or equal to 5 nm, for example, of greater than or equal to 10 nm.

The first and/or the second electrical connection layer comprise(s), for example, at least one of the following materials: Au, Ag, Al, Cr, Cu, Ti, Pt, Ru, NiAu.

In one configuration, the first and/or the second electrical connection layer have/has a multilayer structure. In one development, the multilayer structure contains a layer facing the semiconductor layer sequence and comprising Cr, Ti, Pt, Ru and/or NiAu. A layer of the multilayer structure which is remote from the semiconductor layer sequence can comprise, for example, Al, Ag, Au and/or Cu.

By way of example, a particularly good adhesion of the first and/or the second electrical connection layer to the semiconductor layer sequence and/or the insulating mirror layer can be obtained by means of the layer facing the semiconductor layer sequence. The layer remote from the semiconductor layer sequence has, for example, a particularly good electrical conductivity and/or a particularly high reflection coefficient.

In one advantageous configuration, the layer of the multilayer structure which faces the semiconductor layer sequence is light-transmissive. By way of example, it comprises NiAu. NiAu becomes light-transmissive, in particular, as a result of heating in an oxygen-containing atmosphere. As an alternative or in addition, the layer of the multilayer structure which faces the semiconductor layer sequence can also be light-transmissive on account of its layer thickness. A light-transmissive layer of the multilayer structure which faces the semiconductor layer sequence is advantageous, in particular, if the layer of the multilayer structure which is remote from the semiconductor layer sequence has a particularly high reflection coefficient.

In one configuration, the junction layer contains material of the layer facing the semiconductor layer sequence, that is to say Ti, Pt and/or NiAu. As an alternative or in addition, however, it can also comprise material of the layer remote from the semiconductor layer sequence, that is to say, for example, Al, Ag and/or Au. The material of the layer of the multilayer structure which is remote from the semiconductor layer can pass into the junction layer through the layer facing the semiconductor layer sequence, for example, during the production of the optoelectronic semiconductor chip.

In a further configuration, the optoelectronic semiconductor chip is a thin-film light emitting diode chip. In particular, it has a carrier plate at its rear side. In one configuration, the first and the second electrical connection layers are arranged at least in places between the semiconductor layer sequence and the carrier substrate.

A thin-film light emitting diode chip is distinguished by at least one of the following characteristic features:
  a reflective layer is applied or formed at a main area, facing a carrier element, in particular the carrier plate, of the radiation-generating semiconductor layer sequence, which is a radiation-generating epitaxial layer sequence, in particular, which reflective layer reflects at least part of the electromagnetic generated in the semiconductor layer sequence back into the latter. At least one partial region of the reflective layer is formed, for example, by the electrically insulating mirror layer and/or by the first and/or the second electrical connection layer;

the thin-film light emitting diode chip has a carrier element, which is not a growth substrate on which the semiconductor layer sequence was grown epitaxially, but rather a separate carrier element that was subsequently fixed to the semiconductor layer sequence;

the semiconductor layer sequence has a thickness in the range of 20 µm or less, in particular, in the range of 10 µm or less;

the semiconductor layer sequence is free of a growth substrate. In the present case, "free of a growth substrate" means that a growth substrate used, if appropriate, for the growth process is removed from the semiconductor layer sequence or at least greatly thinned. In particular, it is thinned in such a way that it is not self-supporting by itself or together with the epitaxial layer sequence alone. The remaining residue of the greatly thinned growth substrate is, in particular, unsuitable as such for the function of a growth substrate; and the semiconductor layer sequence contains at least one semiconductor layer with at least one area having an intermixing structure which ideally leads to an approximately ergodic distribution of the light in the semiconductor layer sequence, that is to say that it has, as far as possible, ergodically stochastic scattering behavior.

A basic principle of a thin-film light emitting diode chip is described, for example, in the document I. Schnitzer et al., Appl. Phys. Lett. 63 (16) Oct. 18, 1993, pages 2174-2176, the disclosure content of which in this respect is hereby incorporated by reference. Examples of thin-film light emitting diode chips are described in the documents EP 0905797 A2 and WO 02/13281 A1, the disclosure content of which in this respect is hereby likewise incorporated by reference.

A thin-film light emitting diode chip is to a good approximation a Lambertian surface emitter and is therefore well suited, for example, to application in a headlight, for instance a motor vehicle headlight.

In a method for producing an optoelectronic semiconductor chip, in one configuration, the semiconductor layer sequence having the cutout is provided. Afterward, the first electrical connection layer is deposited onto at least one partial region of a surface of the cutout. As an alternative, it is possible firstly for only a part of the first electrical connection layer to be deposited on at least one partial region of the surface of the cutout. For example, in the case of a first electrical connection layer having a multilayer structure, it is possible for only one of the layers, which, in the completed semiconductor chip, constitutes the layer facing the semiconductor layer sequence, to be deposited. The deposition can be effected by means of an evaporation method, for example.

At the same time as the deposition or after the deposition of the first electrical connection layer or of the part of the first electrical connection layer, in the method, the semiconductor layer sequence and the first electrical connection layer or the part of the first electrical connection layer are heated in such a way that material of the first electrical connection layer penetrates into the semiconductor layer sequence through the surface of the cutout in order to form the junction layer. By way of example, the heating constitutes a sintering process. The material of the first electrical connection layer can penetrate into the semiconductor layer sequence by means of diffusion, for example.

In one configuration, the material of the first electrical connection layer is a eutectic. A eutectic advantageously has a particularly low melting point. In one configuration of the method, the material of the first electrical connection layer is melted at least in places during heating.

In one configuration, the heating of the semiconductor layer sequence and of the first electrical connection layer or respectively of the part of the electrical connection layer is effected at a temperature of greater than or equal to 350° C., in particular, greater than or equal to 400° C. The temperature is preferably less than or equal to 800° C., in particular, less than or equal to 500° C. In one configuration, the first electrical connection layer or the part of the first electrical connection layer is heated in oxygen gas or an oxygen-containing gas mixture.

In a further configuration of the method, a second electrical connection layer or a part of a second connection layer is deposited onto the semiconductor layer sequence. The deposition of the second electrical connection layer can be effected at the same time as the deposition of the first electrical connection layer, before the deposition of the first electrical connection layer or after the deposition of the first electrical connection layer.

In one development of this configuration, before the deposition of the second electrical connection layer, an electrically insulating mirror layer provided with openings is applied onto the rear side of the semiconductor layer sequence. The second electrical connection layer or the part of the second electrical connection layer is expediently deposited onto the semiconductor layer sequence at least in the region of the openings.

Afterward, the semiconductor layer sequence and the second electrical connection layer or the part of the second electrical connection layer are heated in such a way that material of the second electrical connection layer penetrates into the semiconductor layer sequence, in particular, in the region of the openings of the electrically insulating mirror layer in order to form the junction layer.

The heating of the second electrical connection layer can be effected at the same time as, before or after the heating of the first electrical connection layer or respectively of the part of the first electrical connection layer. The temperature is once again preferably greater than or equal to 350° C., in particular, greater than or equal to 400° C. and/or less than or equal to 800° C., in particular, less than or equal to 600° C. The heating can be effected in oxygen gas or in an oxygen-containing gas mixture.

In one configuration of the method, the first electrical connection layer or a part thereof is deposited and heated to a first temperature. Before or after this, the second electrical connection layer or a part thereof is deposited and heated to a second temperature, wherein the second temperature differs from the first temperature. In this configuration, the method is preferably carried out in such a way that firstly that electrical connection layer which is heated to the higher of the two temperatures is deposited and heated.

In a further configuration of the method, the semiconductor layer sequence provided has a growth substrate, which is removed in a subsequent method step, that is to say in a method step which follows the heating of the semiconductor layer sequence with the first and/or second electrical connection layer. In this configuration, it may be provided that the semiconductor layer sequence is fixed to a carrier plate before or after the removal of the growth substrate. This can be effected by means of a eutectic bonding step, a solder connection and/or an adhesive connection, for example.

In this configuration of the method, the first electrical connection layer and/or the second electrical connection layer are/is produced before the connection of the semiconductor layer sequence to the carrier plate. In this way, it is possible, during the production of the electrical connection layers, to heat the semiconductor chip to temperatures which are higher than the temperature up to which the connection between the semiconductor layer sequence and the carrier plate remains stable, and which are necessary for forming the junction layer(s).

BRIEF DESCRIPTION OF THE DRAWINGS

Further advantages and advantageous configurations and developments will become apparent from the following exemplary embodiments illustrated in connection with the figures.

DETAILED DESCRIPTION OF ILLUSTRATIVE EMBODIMENTS

In the figures and exemplary embodiments, constituent parts which are identical, of identical type or act identically are provided with the same reference symbols. The figures and the size relationships of the elements illustrated in the figures among one another should not be regarded as true to scale, unless a scale is explicitly specified. Rather, individual elements, for instance layers, may be illustrated with an exaggerated size in order to provide a better understanding and/or in order to enable better illustration.

Figure 1:
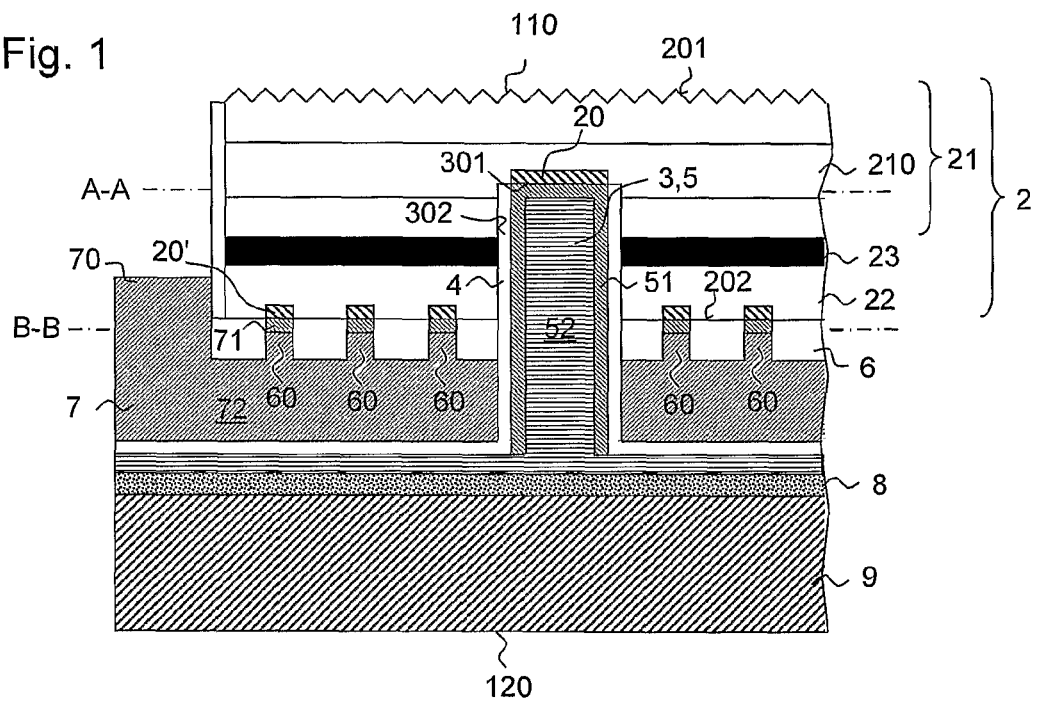
FIG. 1 shows a schematic cross section through an optoelectronic semiconductor chip in accordance with one exemplary embodiment.

FIG. 1 shows a schematic cross section through an optoelectronic semiconductor body in accordance with one exemplary embodiment. The semiconductor body has a semiconductor layer sequence 2. By way of example, the semiconductor layer sequence 2 is based on a III-V compound semiconductor material or on a II-VI compound semiconductor material. In the present case the semiconductor layer sequence 2 is free of a growth substrate and has a thickness of between 5 and 7 μm, inclusive of the limits.

A III/V compound semiconductor material comprises at least one element from the third main group, such as, for example, B, Al, Ga, In, and an element from the fifth main group, such as, for example, N, P, As. In particular, the term "III/V compound semiconductor material" encompasses the group of the binary, ternary or quaternary compounds which contain at least one element from the third main group and at least one element from the fifth main group, for example, nitride and phosphide compound semiconductors. Such a binary, ternary or quaternary compound can additionally comprise, for example, one or more dopants and additional constituents.

A II/VI compound semiconductor material correspondingly comprises at least one element from the second main group, such as, for example, Be, Mg, Ca, Sr, and an element from the sixth main group, such as, for example, O, S, Se. In particular, a II/VI compound semiconductor material comprises a binary, ternary or quaternary compound which comprises at least one element from the second main group and at least one element from the sixth main group. Such a binary, ternary or quaternary compound can additionally comprise, for example, one or more dopants or additional constituents. By way of example, the II/VI compound semiconductor materials include: $ZnO$, $ZnMgO$, $CdS$, $ZnCdS$, $MgBeO$.

The semiconductor layer sequence 2 has a layer 21 of a first conductivity type, which is an n-conducting layer 21 in the present case. The n-conducting layer 21 is succeeded, in the direction from a front side 110 to a rear side 120 of the semiconductor chip, firstly by an active layer 23 and then by a layer of a second conductivity type, a p-conducting layer 22 in the present case. The active layer 23 contains, for example, a multi quantum well structure for generating radiation.

The semiconductor layer sequence can also be embodied as an npn-layer sequence, in which the p-conducting layer 22 is succeeded by a further n-conducting layer in the direction toward the rear side 120 (not illustrated in the figures).

A depression 3 is formed in the semiconductor layer sequence 2, the depression 3 extending from a rear-side main area 202 of the semiconductor layer sequence 2 through the p-conducting layer 22 and through the active layer 23 in the direction of the front side 110. The depression 3 also extends into the n-conducting layer 21 and ends with its bottom area 301 in a central region 210 of the n-conducting layer 21.

The front-side main area 201 of the semiconductor layer sequence 2 in the present case has a structuring and/or roughening, which is provided, in particular, for improving the coupling-out of light from the semiconductor layer sequence 2. The structuring and/or roughening preferably leads to an approximately ergodic distribution of the electromagnetic radiation in the semiconductor layer sequence 2.

The depression 3 has, for example, the form of a circular cylinder or an elliptical cylinder, a parallelepiped, a cone or a truncated cone, a pyramid or a truncated pyramid. As an alternative, the depression 3 can also be embodied as a trench. In this case, the trench preferably has a substantially planar bottom area. In one development, the cross section of the trench increases in the direction from the front side 110 to the rear side 120. Such forms of the cutout 3 are suitable for all configurations of semiconductor chip.

An electrical isolation layer 4 is formed on a part of the surface of the depression 3. In the present case, the isolation layer 4 covers the sidewalls or the circumferential sidewall 302 of the depression 3. The electrical isolation layer 4 is embodied in electrically insulating fashion and comprises, for example, a dielectric such as $SiO_2$, $SiN_x$ or silicon oxynitride or consists thereof.

A partial region of a first electrical connection layer 5 is arranged in the depression 3, and in particular fills the depression 3 completely. The n-conducting layer 21 is electrically connected by means of the metallic first electrical connection layer 5. The electrical isolation layer 4 insulates the first electrical connection layer 5 from the active layer 23 and the p-conducting layer 22.

The central region 210 of the n-conducting layer 21 constitutes a current spreading layer, for example. In particular, an n-type dopant concentration is greater, in particular, greater by a factor of greater than or equal to 5, preferably by a factor of greater than or equal to 10, in the central region 210 than in regions of the n-conducting layer 21 which adjoin the central region 210 in the direction toward the front side 110 and in the direction toward the rear side 120.

As an alternative or in addition, the central region 210 can constitute a current spreading layer embodied as a superlattice of alternating layers (not illustrated in the figures). By way of example, the superlattice contains alternating GaN and AlGaN layers. The layers of the superlattice have, for example, a layer thickness of less than or equal to 10 nm, preferably of less than or equal to 5 nm, particularly preferably of less than or equal to 2 nm. By way of example, in each case one layer of a layer pair, for example, the AlGaN layer, is n-doped and the second layer of the layer pair is undoped or n-doped at least with a lower dopant concentration.

In the present case, an electrically insulating mirror layer 6 adjoins the rear-side main area 202 of the semiconductor layer sequence 2. The electrically insulating mirror layer 6 has openings 60. A second electrical connection layer 7 covers the electrically insulating mirror layer 6 at least in places and extends through the openings 60 of the electrically insulating mirror layer 6 to the semiconductor layer sequence 2. It adjoins the p-conducting layer 22 in the present case.

The p-conducting layer 22 is electrically connected by means of the second electrical connection layer 7. In this way, an operating current can be impressed into the semiconductor layer sequence 2 by means of the first electrical connection layer 5 and the second electrical connection layer 7.

In the present case, the electrical isolation layer 4 expediently covers a partial region of the surface of the second electrical connection layer 7 in addition to the side faces 302 of the depression 3. In particular, it covers that partial region of the surface of the second electrical connection layer 7 which faces the first electrical connection layer 5. In this way, the first and the second electrical connection layers 5, 7 are electrically insulated from one another. The first electrical connection layer 5, the second electrical connection layer 7 and the electrical isolation layer 4 overlap laterally at the rear side 120 of the semiconductor chip.

The semiconductor layer sequence 2 with the electrical connection layers 5, 7 is fixed on a carrier plate 9 by means of a solder or adhesive layer 8. The fixing can also be effected without a solder or adhesive layer 8, for example, by means of a eutectic bonding process.

In the present case, the semiconductor chip is provided for electrical connection from its rear side 120 by means of the first electrical connection layer 5. The solder or adhesive layer 8 and the carrier plate 9 are electrically conductive and are connected to the first electrical connection layer 5 in an electrically conductive fashion.

In the present case, the second electrical connection layer 7 is provided for the electrical connection of the semiconductor chip from the front side 110 thereof. For this purpose, it has an electrical connection region 70 sideways of the semiconductor layer sequence 2.

As an alternative, the second electrical connection layer 7 can also be provided for electrical connection from the rear side 120 and/or the first electrical connection layer 5 can be provided, for example, by means of a contact region arranged laterally alongside the semiconductor layer sequence 2, for the electrical connection of the semiconductor chip from the front side 110 thereof.

In the region of the cutout 3, the semiconductor layer sequence 2 has a junction layer 20 adjoining the first electrical connection layer 5. In the present case, the semiconductor layer sequence 2 also has a junction layer 20' adjoining the second electrical connection layer 7 in the region of the openings 60 of the electrically insulating mirror layer 6.

The junction layer 20 and the further junction layer 20' in each case contain material of the semiconductor layer sequence 2 and material of the respective electrical connection layer adjoining the junction layer 20 and 20', respectively. In the present case, the junction layer 20 contains material of the central region 210 of the n-conducting layer 21 and material of the first electrical connection layer 5. The further junction layer 20' contains material of the p-conducting layer 22 and material of the second electrical connection layer 7.

In the present case, both the first and the second electrical connection layers 5, 7 have a multilayer structure. The first electrical connection layer 5 has an adhesion promoting layer 51 adjoining the semiconductor layer sequence 2 and the electrical isolation layer 4, and the second electrical connection layer 7 has an adhesion promoting layer 71 adjoining the semiconductor layer sequence 2 and the electrically insulating mirror layer 6.

The adhesion promoting layers 51, 71 have, for example, a thickness of less than or equal to 2 nm, preferably of less than or equal to 1 nm. In the present case, the adhesion promoting layers 51, 71 of the first and second electrical connection layers 5, 7, respectively, each have a layer thickness of approximately 1 nm. A reflector layer 52 and 72, respectively, is in each case applied to the adhesion promoting layers 51, 71.

The multilayer structure of the first and/or second electrical connection layer 5, 7 can additionally have a separate current distribution layer, which succeeds the reflector layer 52, 72 in the direction toward the rear side 120 at least in places.

By way of example, the metals Ti, Pt and/or NiAu are suitable for the adhesion promoting layers 51, 71. In the present case, the adhesion promoting layers 51, 71 comprise titanium. The reflector layers 52, 72 comprise aluminum in the present case. The junction layer 20, 20' can contain material of the adhesion promoting layer 51 and 71, respectively, and/or material of the reflector layer 52 and 72, respectively.

Experiments by the inventors have revealed that a particularly low electrical contact resistance is obtained by means of such electrical connection layers 5, 7 in conjunction with the junction layers 20, 20'. By way of example, the specific contact resistance of the first electrical connection layer 5 with respect to the semiconductor layer sequence in the case of the present semiconductor chip is less than or equal to $1\times10^{-4}$ ohms/cm$^2$. By way of example, it has a value of $2\times10^{-5}$ ohms/cm$^2$. In this case, the contact resistance is particularly low on account of the junction layer 20. In the case of a semiconductor chip having the same electrical connection layer 5 but without a junction layer 20, the contact resistance is greater by a factor of five or more, for example, than with the junction layer 20.

In the region of the junction layer 20 and of the further junction layer 20', respectively, the reflectivity of the semiconductor chip at the rear side 120 thereof is reduced by comparison with a semiconductor layer sequence without junction layers 20, 20'. Thus, although the electrical efficiency of the semiconductor chip is increased on account of the low contact resistance, the optical efficiency can be decreased on account of a reduced reflectivity in the region of the cutout 3 and/or of the openings 60. By way of example, the reflectivity in the region of the cutouts 3 is lower by approximately 20 percent than the reflectivity in the region covered by the insulating mirror layer 6.

An area of the electrically insulating mirror layer 6 which is as large as possible would be advantageous for a good reflectivity. An area of the cutout 3 and of the openings 60 which is as large as possible would be advantageous for a contact resistance which is as low as possible. In order to obtain an overall electro-optical efficiency, also called "wall plug efficiency," which is as high as possible, it is advantageous to optimize the total area of the cutout 3 in such a way as to result in a particularly high overall electro-optical efficiency.

Figure 3:
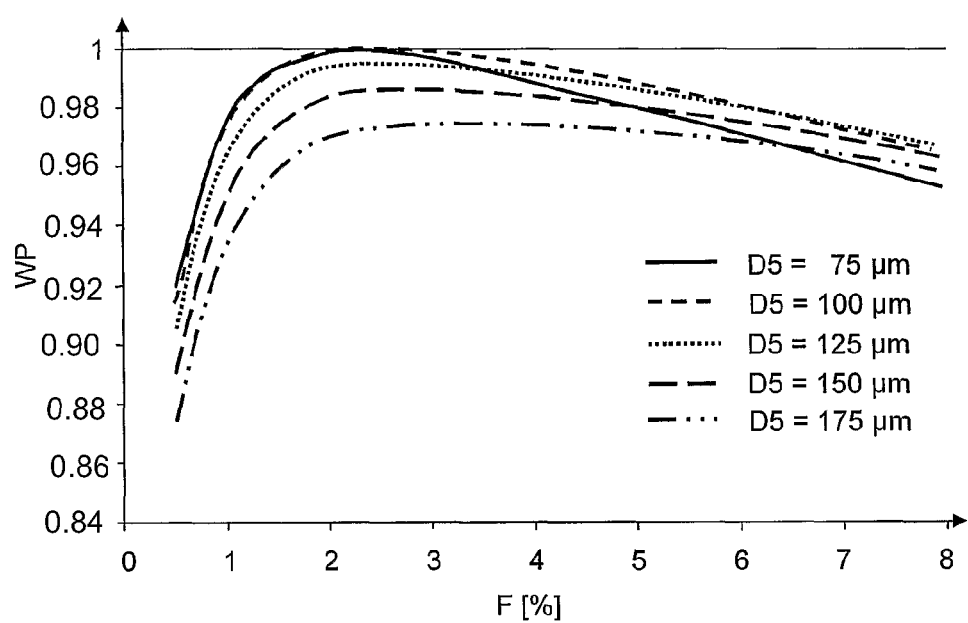
FIG. 3 shows the overall electro-optical efficiency of an optoelectronic semiconductor chip having a plurality of cutouts as a function of the total area of and the distance between the cutouts.

FIG. 3 shows the results of a simulation carried out in this respect by the inventors.

Figure 4A:
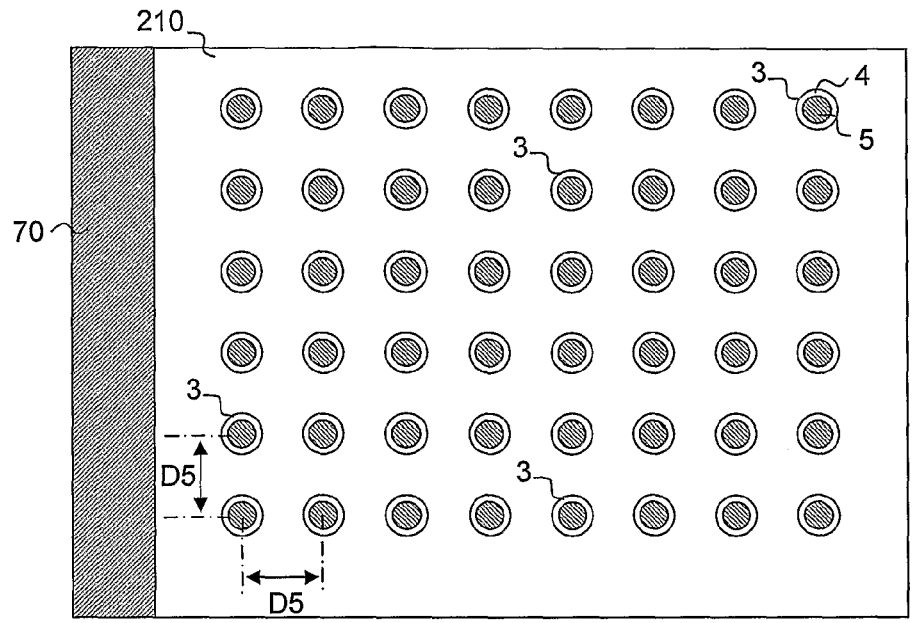
FIG. 4A shows a schematic sectional illustration of the semiconductor chip from FIG. 1 in the plane A-A.

The semiconductor chip has a semiconductor layer sequence 2 having a plurality of cutouts 3. This is schematically illustrated in FIG. 4A in a schematic sectional illustration through the plane A-A. In the present case, the cutouts have a diameter of between 10 and 30 µm, inclusive of the limits. They are arranged in a uniform grid in the present case. Cutouts 3 which succeed one another in rows or columns of the grid have the distance D5 from one another. In this case, the distance is preferably measured from center to center of the adjacent cutouts 3.

FIG. 3 shows the dependence of the relative overall electro-optical efficiency WP on the distance D5 between the cutouts 3 and on the total area F of the cutouts 3. The total area of the cutouts 3 corresponds approximately to the total contact area, that is to say the total electrical connection area, and is designated by F in FIG. 3.

The results illustrated in FIG. 3 relate to a first electrical connection layer 5 having an adhesion promoting layer 51 composed of titanium having a layer thickness of 1 nm and a reflector layer 52 composed of aluminum at an operating current of 1.4 A.

A total contact area F of less than or equal to 5 percent, in particular of less than or equal to 3 percent and of greater than or equal to 1 percent, for example, a total contact area F of 2 percent, have proved to be particularly advantageous. A particularly high overall electro-optical efficiency WP arises in the case of a distance D5 between the cutouts 3 of between 75 and 125 µm.

Figure 4B:
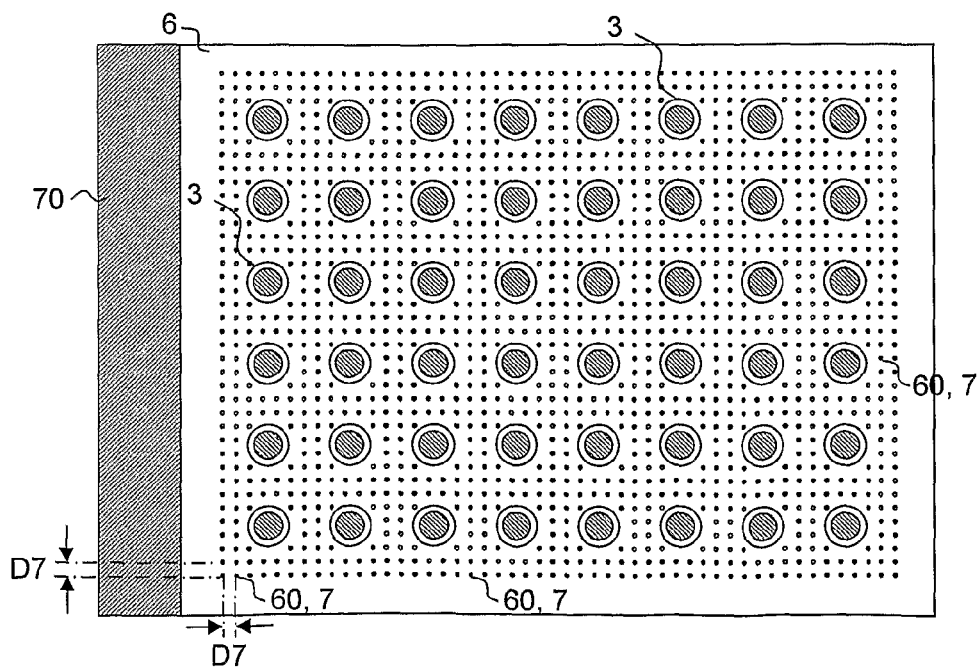
FIG. 4B shows a schematic sectional view of the semiconductor body in accordance with FIG. 1 in the plane B-B.

FIG. 4B shows a schematic sectional illustration of the semiconductor chip in the plane B-B (see FIG. 1) running through the openings 60 of the electrically insulating mirror layer 6.

In the present case, the openings 60 filled with a partial region of the second electrical connection layer 7 are arranged in a grid like the cutouts 3.

Openings 60 that are respectively adjacent in rows or columns of the grid have a distance D7 from one another. A value of less than or equal to 5 µm has proved to be advantageous for the distance D7. A diameter of the openings 60 is preferably less than or equal to 1 µm, for example, less than or equal to 500 nm. In the present case, the openings have a diameter of approximately 200 nanometers. The distance D7 between two successive openings 60 is preferably less than or equal to ten times the maximum lateral extent of the openings 60, wherein the maximum lateral extent is, for example, the diameter or the diagonal of the opening 60. This reduces the risk of the homogeneity of the current impression into the active layer 23 being impaired by a comparatively low transverse conductivity of the p-conducting layer 22.

Figure 2:
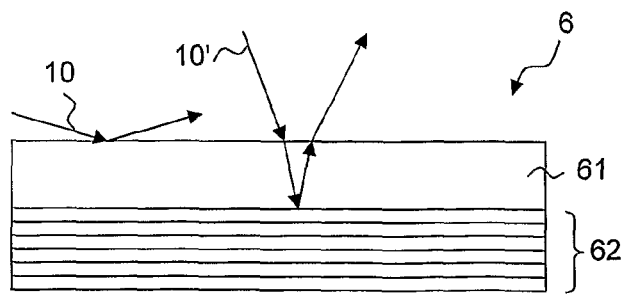
FIG. 2 shows a schematic cross section through an electrically insulating mirror layer in accordance with one exemplary embodiment.

FIG. 2 shows a schematic cross section through an advantageous exemplary embodiment of an electrically insulating mirror layer 6 for the optoelectronic semiconductor chip. In accordance with this exemplary embodiment, the electrically insulating mirror layer 6 contains a layer facing the front side 110 and consisting of a low refractive index material 61, and a Bragg reflector 62 facing the rear side 120.

The layer of low refractive index material 61 is, for example, a silicon dioxide layer containing air-filled pores having a diameter of less than or equal to 8 nm, for example a diameter of approximately 3 nm. In the case of an irregularly shaped pore, the diameter is, in particular, the diameter of the smallest sphere which completely contains the pore.

The low refractive index layer 61 has a refractive index that is less than the refractive index of that layer of the semiconductor layer sequence 2 which adjoins it, the p-conducting layer 22 in the present case. A light beam 10 incident on the low refractive index layer 61 comparatively shallowly is reflected back to the front side 110 at the layer 61 by means of total reflection. A particularly high critical angle of total reflection is obtained by means of the low refractive index material.

A further light beam 10', which impinges on the electrically insulating mirror layer 6 so steeply that it is not totally reflected at the low refractive index layer 61, penetrates through the latter and is reflected by the Bragg reflector 62. For this purpose, the Bragg reflector 62 is advantageously tuned with respect to the electromagnetic radiation emitted by the active layer 23.

By means of the electrically insulating mirror layer 6 comprising low refractive index layer 61 and Bragg reflector 62, a high reflectivity is obtained both for radiation 10 impinging on the mirror layer shallowly and for radiation 10' impinging on the mirror layer 6 steeply. Since the reflection is effected by means of total reflection or interference, a particularly small proportion of the impinging electromagnetic radiation is absorbed, with the result that the efficiency of the mirror layer 6 is particularly high.

During the production of the semiconductor chip in accordance with the exemplary embodiment in FIG. 1, by way of example, firstly the second electrical connection layer 7 is deposited on the semiconductor layer sequence 2 and the electrically insulating mirror layer 6, for instance by means of an evaporation method such as a physical or chemical evaporation process (PVD, physical vapor deposition; CVD, chemical vapor deposition).

The semiconductor layer sequence 2 with the second electrical connection layer 7 is then heated in a furnace, preferably under a protective gas atmosphere, for example, to a temperature of 600° C. In the process, material of the second electrical connection layer penetrates into the p-conducting layer 22 and forms the further junction layer 20'.

In one variant, before heating, only a part of the second electrical connection layer 7 is deposited, for example, the adhesion promoting layer 71. In this case, the second electrical connection layer 7 is completed after heating.

In one development of this variant, the openings 60 in the mirror layer 6 are produced by means of a lithography mask. The part of the second electrical connection layer 7 can then be deposited into the openings 60 and onto the lithography mask. Afterward still before heating, the lithography mask is removed. In this case, the material of the second electrical connection layer 7 that was deposited on the lithography mask is simultaneously removed.

Afterward, the first electrical connection layer 5 is deposited from the rear side 120 of the semiconductor chip on the isolation layer 4 over the second electrical connection layer 7 and in the cutout 3. The deposition can likewise be effected by means of an evaporation method, for example.

Afterward, the semiconductor layer sequence 2 with the first and the second electrical connection layers 5, 7 is once again heated, for example, to a temperature of 500° C. In the process, material of the first electrical connection layer 5 penetrates into the central region 210 of the n-conducting layer 21 to form the junction layer 20.

In one variant of the method, the heating of the first and of the second electrical connection layers 5, 7 for forming the junction layers 20, 20' can be effected in one and the same step. Production of the first electrical connection layer 5 before the second electrical connection layer 7 is also conceivable. In the case of two separate heating steps, it is advantageous if firstly the heating step with the higher temperature is performed, followed by the heating step with the lower temperature.

During the heating of a connection layer 5, 7, having a multilayer structure 51, 52 and 71, 72, respectively, it is conceivable for material of the reflector layer 52, 72, for example, to penetrate through the adhesion promoting layer 51 and 71, respectively, and to penetrate into the semiconductor layer sequence 2.

The junction layers 20, 20' thus produced have, for example, a layer thickness of greater than or equal to 5 nm, of greater than or equal to 10 nm in one configuration.

In one preferred variant of the method, the semiconductor layer sequence 2 has a growth substrate during the heating steps or during the heating step at the front side 110 of the semiconductor layer sequence 2, the semiconductor layer sequence 2 having been grown epitaxially on the growth substrate. The growth substrate is removed from the semiconductor layer sequence 2 after the heating of the first and second electrical connection layers 5, 7. The remaining semiconductor layer sequence then preferably has a layer thickness of less than or equal to 10 µm.

In a method for producing the semiconductor chip in accordance with the exemplary embodiment in FIG. 1, the connection of the semiconductor layer sequence 2 to the carrier plate 9 is effected before or after the removal of the growth substrate.

In one typical configuration, the connection of the carrier plate 9 to the semiconductor layer sequence 2, for example, by means of the adhesive or solder layer 8, is stable up to temperatures of less than or equal to 300° C. Therefore, it is important for the connection of the semiconductor layer sequence 2 to the carrier plate 9 to be effected after the heating of the semiconductor layer sequence 2 and the electrical connection layers 5, 7 for forming the junction layers 20, 20'. In order to ensure the stability of the semiconductor chip during the production method it is advantageous if the semiconductor layer sequence 2 is still connected to the growth substrate during heating for producing the junction layers 20, 20'. This is advantageously made possible by both the n-side and the p-side contact-connection being effected from the rear side 120 of the semiconductor chip.

The invention is not restricted to the exemplary embodiments by the description on the basis of the exemplary embodiments. Rather, it encompasses any novel feature and also any combination of features. This includes, in particular, any combination of features in the patent claims, even if this feature or this combination itself is not explicitly specified in the patent claims or exemplary embodiments.

The invention claimed is:

1. An optoelectronic semiconductor chip comprising:
   a semiconductor layer sequence having an active layer provided for generating radiation, the active layer between a layer of a first conductivity type and a layer of a second conductivity type,
   wherein the layer of the first conductivity type is adjacent to a front side of the semiconductor layer sequence,
   wherein the semiconductor layer sequence contains at least one cutout extending from a rear side of the semiconductor layer sequence through the active layer to the layer of the first conductivity type, the rear side opposite the front side,
   wherein the layer of the first conductivity type is electrically connected through the cutout by a first electrical connection layer that covers the rear side of the semiconductor layer sequence at least in places, and
   wherein the optoelectronic semiconductor chip contains a junction layer adjacent the cutout, the junction layer comprising a material composition comprising material of the layer of the first conductivity type and material of the first electrical connection layer.

2. The optoelectronic semiconductor chip as claimed in claim 1, wherein the semiconductor layer sequence comprises a plurality of cutouts having a lateral distance from one another, the lateral distance greater than or equal to 75 µm and less than or equal to 125 µm.

3. The optoelectronic semiconductor chip as claimed in claim 1, wherein a total area of the cutouts is less than or equal to 5% of an area of the semiconductor layer sequence in a plan view of the rear side.

4. The optoelectronic semiconductor chip as claimed in claim 1, further comprising:
   an electrically insulating minor layer at the rear side of the semiconductor layer sequence and
   a second electrical connection layer,
   wherein the second electrical connection layer covers the rear side of the semiconductor layer sequence at least in places and is electrically insulated from the first electrical connection layer by an electrical isolation layer,
   wherein the first electrical connection layer, the second electrical connection layer and the electrical isolation layer overlap laterally,
   wherein the electrically insulating layer has a plurality of openings, and
   wherein the layer of the second conductivity type is electrically connected through the openings by the second electrical connection layer.

5. The optoelectronic semiconductor chip as claimed in claim 4, further comprising a further junction layer between the second electrical connection layer and the layer of the second conductivity type, the further junction layer having a material composition comprising material of the layer of the second conductivity type and material of the second electrical connection layer.

6. The optoelectronic semiconductor chip as claimed in claim 4, wherein the openings have a lateral distance from one another of less than or equal to 5 µm.

7. The optoelectronic semiconductor chip as claimed in claim 4, wherein a ratio between a distance between two adjacent openings and a maximum lateral extent of one of the openings is less than or equal to 10.

8. The optoelectronic semiconductor chip as claimed in claim 4, wherein the junction layer and/or the further junction layer has a layer thickness of greater than or equal to 5 nm.

9. The optoelectronic semiconductor chip as claimed in claim 4, wherein the first and/or the second electrical connection layer comprises at least one of the following materials: Au, Ag, Al, Cr, Cu, Ti, Pt, Ru, NiAu.

10. The optoelectronic semiconductor chip as claimed in claim 9, wherein the first and/or the second electrical connection layer has a multilayer structure having a layer facing the semiconductor layer sequence and comprising Cr, Ti, Pt, Ru and/or NiAu and a layer remote from the semiconductor layer sequence and comprising Al, Ag, Au and/or Cu.

11. The optoelectronic semiconductor chip as claimed in claim 1, further comprising a carrier plate on which the semiconductor layer sequence is located.

12. The optoelectronic semiconductor chip as claimed in claim 1, wherein a total area of the cutouts is less than or equal to 2% of an area of the semiconductor layer sequence in a plan view of the rear side.

13. The optoelectronic semiconductor chip as claimed in claim 11, wherein the chip is free of a growth substrate.

14. The optoelectronic semiconductor chip as claimed in claim 1, wherein the junction layer has a layer thickness of greater than or equal to 5 nm.

15. The optoelectronic semiconductor chip as claimed in claim 1, wherein the first electrical connection layer comprises at least one of the following materials: Au, Ag, Al, Cr, Cu, Ti, Pt, Ru, NiAu.

16. The optoelectronic semiconductor chip as claimed in claim 15, wherein the first electrical connection layer has a multilayer structure having a layer facing the semiconductor layer sequence and comprising Cr, Ti, Pt, Ru and/or NiAu and a layer remote from the semiconductor layer sequence and comprising Al, Ag, Au and/or Cu.

* * * * *